United States Patent
Jeon et al.

(10) Patent No.: US 9,184,118 B2
(45) Date of Patent: Nov. 10, 2015

(54) MICRO LEAD FRAME STRUCTURE HAVING REINFORCING PORTIONS AND METHOD

(71) Applicant: Amkor Technology, Inc., Chandler, AZ (US)

(72) Inventors: Hyeong Il Jeon, Gyeonggi-do (KR); Hyung Kook Chung, Seoul (KR); Hong Bae Kim, Seoul (KR); Byong Jin Kim, Gyeonggi-do (KR)

(73) Assignee: Amkor Technology Inc., Tempe, AZ (US)

( * ) Notice: Subject to any disclaimer, the term of this patent is extended or adjusted under 35 U.S.C. 154(b) by 0 days.

(21) Appl. No.: 14/268,877

(22) Filed: May 2, 2014

(65) Prior Publication Data

US 2014/0327122 A1 Nov. 6, 2014

(30) Foreign Application Priority Data

May 2, 2013 (KR) .......................... 10-2013-0049217

(51) Int. Cl.
*H01L 23/495* (2006.01)
*H01L 23/00* (2006.01)
(Continued)

(52) U.S. Cl.
CPC .... *H01L 23/49541* (2013.01); *H01L 23/49548* (2013.01); *H01L 24/97* (2013.01); *H01L 23/3107* (2013.01); *H01L 23/4334* (2013.01); *H01L 23/49568* (2013.01); *H01L 23/49582* (2013.01); *H01L 2224/32245* (2013.01); *H01L 2224/48091* (2013.01);
(Continued)

(58) Field of Classification Search
CPC .................. H01L 23/49548; H01L 23/49541; H01L 24/97; H01L 2224/48091; H01L 23/49568; H01L 23/4334; H01L 2224/97; H01L 23/3107; H01L 2224/32245; H01L 23/49582; H01L 2224/48247; H01L 2224/49052; H01L 2224/73265; H01L 2924/00012; H01L 2224/85

See application file for complete search history.

(56) References Cited

U.S. PATENT DOCUMENTS

| 2,596,993 | A | 5/1952 | Gookin |
| 3,435,815 | A | 4/1969 | Forcier |
| 3,734,660 | A | 5/1973 | Davies et al. |

(Continued)

FOREIGN PATENT DOCUMENTS

| DE | 19734794 A1 | 8/1997 |
| EP | 0393997 | 10/1990 |

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Khiem D Nguyen
(74) *Attorney, Agent, or Firm* — Kevin B. Jackson

(57) ABSTRACT

In one embodiment, a micro lead frame structure includes one or more stiffness reinforcing structures formed on leads and/or connecting structures. The stiffness reinforcing structures can be formed by leaving predetermined portions of the micro lead frame at full thickness including, for example, portions of an inner lead, portions of an outer lead, and portions of a connecting bar, combinations thereof, and other structures. The stiffness reinforcing structures are configured to reduce deformation defects and electrical short defects caused by assembly processes.

20 Claims, 8 Drawing Sheets

(51) Int. Cl.
  *H01L 23/31* (2006.01)
  *H01L 23/433* (2006.01)
(52) U.S. Cl.
  CPC ........... *H01L 2224/48247* (2013.01); *H01L 2224/49052* (2013.01); *H01L 2224/73265* (2013.01); *H01L 2224/97* (2013.01)

(56) References Cited

U.S. PATENT DOCUMENTS

| | | |
|---|---|---|
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba et al. |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe et al. |
| 4,451,224 A | 5/1984 | Harding et al. |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick et al. |
| 4,737,839 A | 4/1988 | Burt et al. |
| 4,756,080 A | 7/1988 | Thorp et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry et al. |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane et al. |
| 5,057,900 A | 10/1991 | Yamazaki et al. |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi et al. |
| 5,157,480 A | 10/1992 | McShane et al. |
| 5,168,368 A | 12/1992 | Gow et al. |
| 5,172,213 A | 12/1992 | Zimmerman et al. |
| 5,172,214 A | 12/1992 | Casto et al. |
| 5,175,060 A | 12/1992 | Enomoto et al. |
| 5,200,362 A | 4/1993 | Lin et al. |
| 5,200,809 A | 4/1993 | Kwon et al. |
| 5,214,845 A | 6/1993 | King et al. |
| 5,216,278 A | 6/1993 | Lin et al. |
| 5,218,231 A | 6/1993 | Kudo et al. |
| 5,221,642 A | 6/1993 | Burns et al. |
| 5,250,841 A | 10/1993 | Sloan et al. |
| 5,252,853 A | 10/1993 | Michii et al. |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto |
| 5,278,446 A | 1/1994 | Nagaraj et al. |
| 5,279,029 A | 1/1994 | Burns et al. |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy et al. |
| 5,336,931 A | 8/1994 | Juskey et al. |
| 5,343,076 A | 8/1994 | Katayama et al. |
| 5,358,905 A | 10/1994 | Chiu et al. |
| 5,365,106 A | 11/1994 | Watanabe et al. |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu et al. |
| 5,493,151 A | 2/1996 | Asada et al. |
| 5,508,556 A | 4/1996 | Lin et al. |
| 5,517,056 A | 5/1996 | Bigler et al. |
| 5,521,429 A | 5/1996 | Aono et al. |
| 5,528,076 A | 6/1996 | Pavio et al. |
| 5,534,467 A | 7/1996 | Rostoker et al. |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber et al. |
| 5,277,972 B1 | 11/1996 | Sakumoto et al. |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki et al. |
| 5,595,934 A | 1/1997 | Kim et al. |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott |
| 5,637,922 A | 6/1997 | Fillion et al. |
| 5,639,990 A | 6/1997 | Nishihara et al. |
| 5,640,047 A | 6/1997 | Nakashima et al. |
| 5,641,997 A | 6/1997 | Ohta et al. |
| 5,643,433 A | 7/1997 | Fukase et al. |
| 5,644,169 A | 7/1997 | Chun et al. |
| 5,646,831 A | 7/1997 | Manteghi et al. |
| 5,650,663 A | 7/1997 | Parthasarathi et al. |
| 5,661,088 A | 8/1997 | Tessier et al. |
| 5,665,996 A | 9/1997 | Williams et al. |
| 5,673,479 A | 10/1997 | Hawthorne et al. |
| 5,683,806 A | 11/1997 | Sakumoto et al. |
| 5,683,943 A | 11/1997 | Yamada et al. |
| 5,689,135 A | 11/1997 | Ball et al. |
| 5,696,666 A | 12/1997 | Miles et al. |
| 5,701,034 A | 12/1997 | Marrs et al. |
| 5,703,407 A | 12/1997 | Hori et al. |
| 5,710,064 A | 1/1998 | Song et al. |
| 5,723,899 A | 3/1998 | Shin et al. |
| 5,724,233 A | 3/1998 | Honda et al. |
| 5,726,493 A | 3/1998 | Yamashita et al. |
| 5,736,432 A | 4/1998 | Mackessy et al. |
| 5,745,984 A | 5/1998 | Cole et al. |
| 5,753,532 A | 5/1998 | Sim et al. |
| 5,753,977 A | 5/1998 | Kusaka et al. |
| 5,766,972 A | 6/1998 | Takahashi et al. |
| 5,767,566 A | 6/1998 | Suda et al. |
| 5,770,888 A | 6/1998 | Song et al. |
| 5,776,798 A | 7/1998 | Quan et al. |
| 5,783,861 A | 7/1998 | Son et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda et al. |
| 5,821,457 A | 10/1998 | Mosley et al. |
| 5,821,615 A | 10/1998 | Lee et al. |

(56) References Cited

U.S. PATENT DOCUMENTS

| | | |
|---|---|---|
| 5,834,830 A | 11/1998 | Cho et al. |
| 5,835,988 A | 11/1998 | Ishii et al. |
| 5,844,306 A | 12/1998 | Fujita et al. |
| 5,854,511 A | 12/1998 | Shin et al. |
| 5,854,512 A | 12/1998 | Manteghi et al. |
| 5,856,911 A | 1/1999 | Riley et al. |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer et al. |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi et al. |
| 6,143,981 A | 11/2000 | Glenn et al. |
| 6,150,709 A | 11/2000 | Shin et al. |
| 6,166,430 A | 12/2000 | Yamaguchi et al. |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,238,952 B1 | 5/2001 | Lin |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 5,814,884 C1 | 1/2002 | Davis et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Olofsson et al. |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori |
| 6,495,909 B2 | 12/2002 | Jung et al. |
| 6,498,099 B1 | 12/2002 | McLellan et al. |
| 6,498,392 B2 | 12/2002 | Azuma |
| 6,501,165 B1 | 12/2002 | Farnworth et al. |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 * | 4/2003 | Huang .................... 257/433 |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku et al. |
| 6,667,546 B2 | 12/2003 | Huang et al. |
| 6,677,663 B1 | 1/2004 | Ku et al. |
| 6,686,649 B1 | 2/2004 | Mathews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 | 11/2004 | Foster |
| 6,838,761 B2 | 1/2005 | Karnezos |
| 6,858,919 B2 | 2/2005 | Seo et al. |
| 6,861,288 B2 | 3/2005 | Shim et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,906,416 B2 | 6/2005 | Karnezos |
| 6,927,478 B2 | 8/2005 | Paek |
| 6,933,598 B2 | 8/2005 | Karnezos |
| 6,946,323 B1 | 9/2005 | Heo |
| 6,967,125 B2 | 11/2005 | Fee et al. |

(56) References Cited

U.S. PATENT DOCUMENTS

| | | | |
|---|---|---|---|
| 6,972,481 | B2 | 12/2005 | Karnezos |
| 6,995,459 | B2 | 2/2006 | Lee et al. |
| 7,002,805 | B2 | 2/2006 | Lee et al. |
| 7,005,327 | B2 | 2/2006 | Kung et al. |
| 7,015,571 | B2 | 3/2006 | Chang et al. |
| 7,034,387 | B2 | 4/2006 | Karnezos |
| 7,045,396 | B2 * | 5/2006 | Crowley et al. ............... 438/123 |
| 7,045,887 | B2 | 5/2006 | Karnezos |
| 7,049,691 | B2 | 5/2006 | Karnezos |
| 7,053,469 | B2 | 5/2006 | Koh et al. |
| 7,053,476 | B2 | 5/2006 | Karnezos |
| 7,053,477 | B2 | 5/2006 | Karnezos et al. |
| 7,057,269 | B2 | 6/2006 | Karnezos |
| 7,061,088 | B2 | 6/2006 | Karnezos |
| 7,064,426 | B2 | 6/2006 | Karnezos |
| 7,075,816 | B2 | 7/2006 | Fee et al. |
| 7,101,731 | B2 | 9/2006 | Karnezos |
| 7,102,209 | B1 | 9/2006 | Bayan et al. |
| 7,109,572 | B2 | 9/2006 | Fee et al. |
| 7,166,494 | B2 | 1/2007 | Karnezos |
| 7,169,642 | B2 | 1/2007 | Karnezos |
| 7,185,426 | B1 | 3/2007 | Hiner et al. |
| 7,193,298 | B2 | 3/2007 | Hong et al. |
| 7,202,554 | B1 | 4/2007 | Kim et al. |
| 7,205,647 | B2 | 4/2007 | Karnezos |
| 7,211,471 | B1 | 5/2007 | Foster |
| 7,245,007 | B1 | 7/2007 | Foster |
| 7,247,519 | B2 | 7/2007 | Karnezos et al. |
| 7,253,503 | B1 | 8/2007 | Fusaro et al. |
| 7,253,511 | B2 | 8/2007 | Karnezos et al. |
| 7,271,496 | B2 | 9/2007 | Kim |
| 7,279,361 | B2 | 10/2007 | Karnezos |
| 7,288,434 | B2 | 10/2007 | Karnezos |
| 7,288,835 | B2 | 10/2007 | Yim et al. |
| 7,298,037 | B2 | 11/2007 | Yim et al. |
| 7,298,038 | B2 | 11/2007 | Filoteo, Jr. et al. |
| 7,306,973 | B2 | 12/2007 | Karnezos |
| 7,312,519 | B2 | 12/2007 | Song et al. |
| 7,375,416 | B2 | 5/2008 | Retuta et al. |
| 7,982,298 | B1 | 7/2011 | Kang et al. |
| 8,106,495 | B2 | 1/2012 | Kajiki |
| 2001/0008305 | A1 | 7/2001 | McLellan et al. |
| 2001/0014538 | A1 | 8/2001 | Kwan et al. |
| 2002/0011654 | A1 | 1/2002 | Kimura |
| 2002/0024122 | A1 | 2/2002 | Jung et al. |
| 2002/0027297 | A1 | 3/2002 | Ikenaga et al. |
| 2002/0038873 | A1 | 4/2002 | Hiyoshi |
| 2002/0072147 | A1 | 6/2002 | Sayanagi et al. |
| 2002/0111009 | A1 | 8/2002 | Huang et al. |
| 2002/0140061 | A1 | 10/2002 | Lee |
| 2002/0140068 | A1 | 10/2002 | Lee et al. |
| 2002/0140081 | A1 | 10/2002 | Chou et al. |
| 2002/0158318 | A1 | 10/2002 | Chen |
| 2002/0163015 | A1 | 11/2002 | Lee et al. |
| 2002/0167060 | A1 | 11/2002 | Buijsman et al. |
| 2003/0001244 | A1 | 1/2003 | Araki et al. |
| 2003/0006055 | A1 | 1/2003 | Chien-Hung et al. |
| 2003/0030131 | A1 | 2/2003 | Lee et al. |
| 2003/0059644 | A1 | 3/2003 | Datta et al. |
| 2003/0064548 | A1 | 4/2003 | Isaak |
| 2003/0073265 | A1 | 4/2003 | Hu et al. |
| 2003/0102537 | A1 | 6/2003 | McLellan et al. |
| 2003/0164554 | A1 | 9/2003 | Fee et al. |
| 2003/0168719 | A1 | 9/2003 | Cheng et al. |
| 2003/0178708 | A1 * | 9/2003 | Minamio et al. ............... 257/666 |
| 2003/0198032 | A1 | 10/2003 | Collander et al. |
| 2004/0027788 | A1 | 2/2004 | Chiu et al. |
| 2004/0056277 | A1 | 3/2004 | Karnezos |
| 2004/0061212 | A1 | 4/2004 | Karnezos |
| 2004/0061213 | A1 | 4/2004 | Karnezos |
| 2004/0063242 | A1 | 4/2004 | Karnezos |
| 2004/0063246 | A1 | 4/2004 | Karnezos |
| 2004/0065963 | A1 | 4/2004 | Karnezos |
| 2004/0080025 | A1 | 4/2004 | Kasahara et al. |
| 2004/0089926 | A1 | 5/2004 | Hsu et al. |
| 2004/0164387 | A1 | 8/2004 | Ikenaga et al. |
| 2004/0253803 | A1 | 12/2004 | Tomono et al. |
| 2005/0184377 | A1 | 8/2005 | Takeuchi et al. |
| 2006/0087020 | A1 | 4/2006 | Hirano et al. |
| 2006/0157843 | A1 | 7/2006 | Hwang |
| 2006/0231928 | A1 | 10/2006 | Dotta et al. |
| 2006/0231939 | A1 | 10/2006 | Kawabata et al. |
| 2007/0023202 | A1 | 2/2007 | Shibata et al. |
| 2007/0152313 | A1 | 7/2007 | Periaman et al. |
| 2008/0142941 | A1 | 6/2008 | Yew et al. |
| 2008/0230887 | A1 | 9/2008 | Sun et al. |
| 2008/0272465 | A1 | 11/2008 | Do et al. |
| 2009/0014851 | A1 | 1/2009 | Choi et al. |
| 2009/0057918 | A1 | 3/2009 | Kim |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |

(56) References Cited

FOREIGN PATENT DOCUMENTS

| | | |
|---|---|---|
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | EP0936671 | 8/1999 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

\* cited by examiner

MICRO LEAD FRAME STRUCTURE HAVING REINFORCING PORTIONS AND METHOD

CROSS REFERENCE TO RELATED APPLICATION

This application claims priority to Korean Patent Application No. 10-2013-0049217 filed on May 2, 2013, which is expressly incorporated by reference herein.

BACKGROUND

Embodiments disclosed herein relate generally to electronic devices and, more specifically, to near chip scale package electronic device structures and methods of fabricating the same.

Electronic devices such as semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, a semiconductor die, bonding material to attach the semiconductor die to the leadframe, bond wires that electrically connect pads on the semiconductor die to individual leads of the leadframe, and a hard plastic encapsulant material that covers at least some of the components and forms the exterior of the semiconductor package commonly referred to as the package body.

The lead frame is the central supporting structure of such a package, and typically is fabricated by chemically etching or mechanically stamping a metal strip. The lead frame typically includes a side frame defining an entire framework, a chip pad for mounting one or more semiconductor chips, one or more tie bars integrally connecting the side frame to the chip pad, and a plurality of leads extending from the side frame to the corners of the chip pad. A portion of the leadframe is internal to the package body or completely surrounded by the plastic encapsulant. Portions of the leads of the leadframe may extend externally from the package body or may be partially exposed therein for use in electrically connecting the package to another component. In certain semiconductor packages, a portion of the die pad of the leadframe also remains exposed within the package body.

There is a class of semiconductor packages referred to as near chip scale packages (CSP) that include very thin, fine pitch, and small area leadframes that approximate the size of the semiconductor chip. Such packages include the MicroLeadFrame® (MLF) style of packages, LFCSP, VQFN, and QFN—Quad Flat No-Lead packages. These packages typically have package body sizes in the 1 mm to 13 mm range and package heights in the 0.3 mm to 2.1 mm range. In order to enhance unit productivity, near chip scale packages such as MLF style packages are assembled in a matrix of multiple leadframes and encapsulated in an overmolding process. The individual MLF structures are then separated into individual packages typically using a sawing process, which cuts through the mold compound and the leadframes.

Several problems exist with current leadframe structures for near chip scale packages because of their reduced size and the way they are manufactured. Such problems include deformation or shifting of the leads during manufacturing where they become vertically tilted or curved or horizontally bent or curved. These defects can result in electrical shorts and device failures. Also, as each lead is pressed and cut during the sawing process, metal burrs result that can create a metal bridge between adjoining leads thus resulting in electrical shorts and device failure.

Accordingly, it is desirable to have a structure and method that provides a reinforced or strengthened leadframe for electronic packages, such as near chip scale packaged electronic devices. It is also desirable to have a structure a method that is cost effective, easy to integrate into assembly process flows, and reliable.

For simplicity and clarity of the illustration, elements in the figures are not necessarily drawn to scale, and the same reference numbers in different figures can denote the same elements. The use of the word about, approximately or substantially means that a value of an element has a parameter that is expected to be close to a stated value or position. However, as is well known in the art there are always minor variances that prevent the values or positions from being exactly as stated. Additionally, descriptions and details of well-known steps and elements may be omitted for simplicity of the description.

DETAILED DESCRIPTION OF THE DRAWINGS

The aspects of the present invention and methods for achieving the aspects will be apparent by referring to the embodiments to be described herein with reference to the accompanying drawings. It is understood that the embodiments described herein are illustrative only and that the present invention is not limited thereto, but can be implemented in alternative forms. Also, it is understood that the features of the various embodiments described herein can be combined with each other, unless specifically noted otherwise.

In general, the present embodiments relate to a lead frame structure including a micro lead frame for manufacturing a packaged electronic device, which includes stiffness reinforcing portions formed on one or more leads or other sections of the micro lead frame, thus reducing the deformation or shifting of the leads during manufacturing of the electronic package, particularly in the sawing or singulation process. Also, in some embodiments the structure of the stiffness reinforcing portions provide an increase in the spacing or distance between adjacent leads thereby reducing electrical shorting defects caused by metal burrs, which result from singulation processes.

Figure 7:
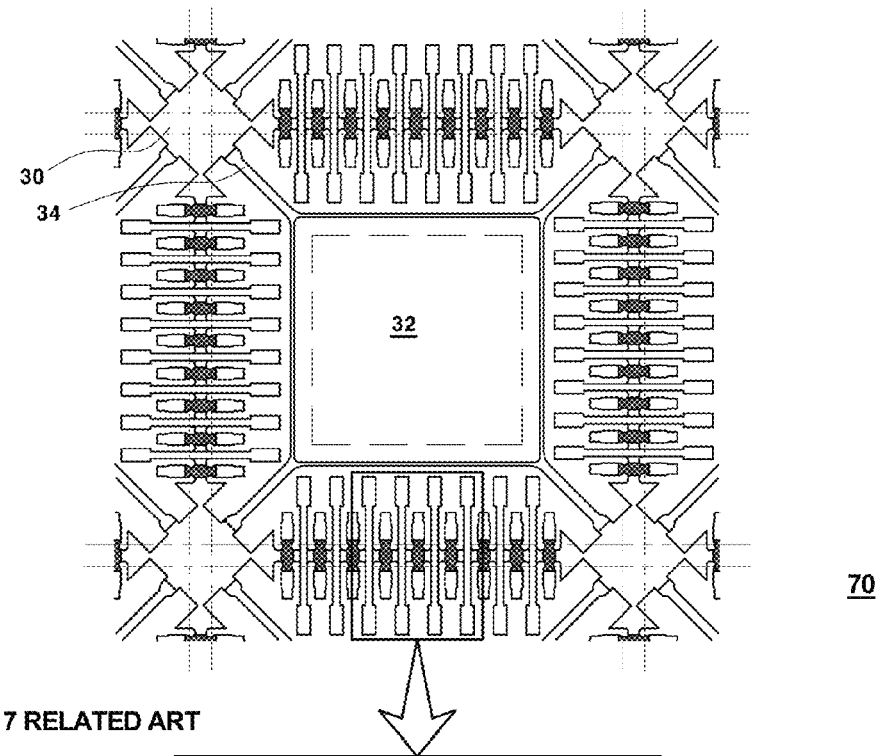
FIG. 7 is a top plan view showing a related micro lead frame.
Figure 7A:
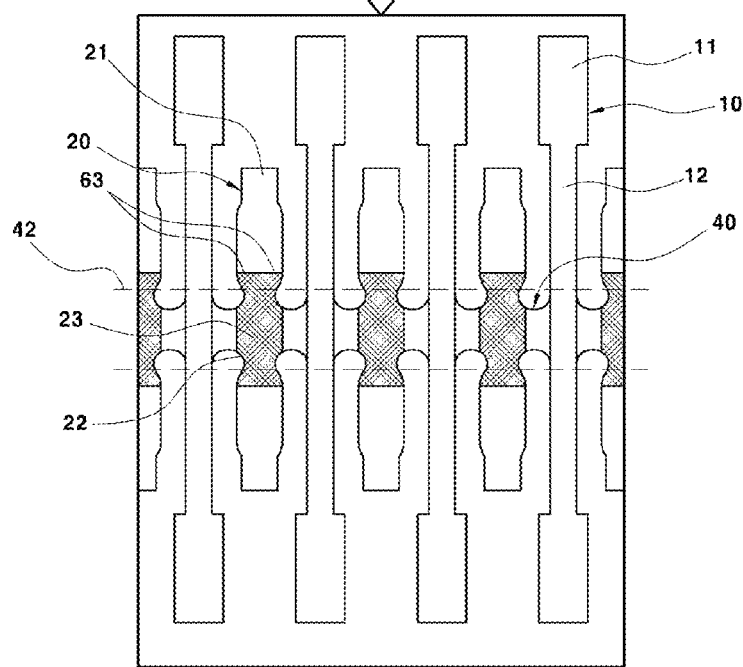
FIG. 7A is an enlarged top plan view of encircled portion of the related micro lead frame of FIG. 7.
Figure 8:
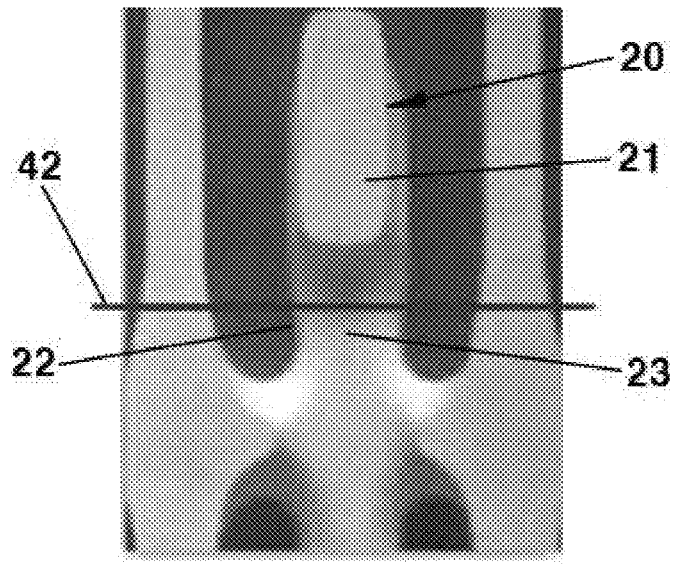
FIG. 8 is a top plan image of the related micro lead frame of FIG. 7.
Figure 10:
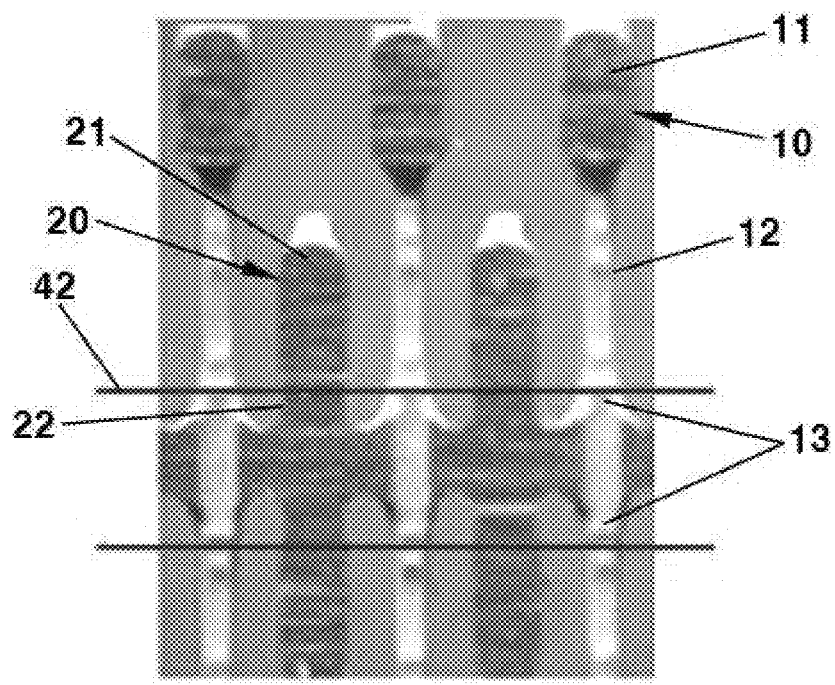
FIG. 10 is a bottom plan image of the related micro lead frame of FIG. 9.
Figure 9:
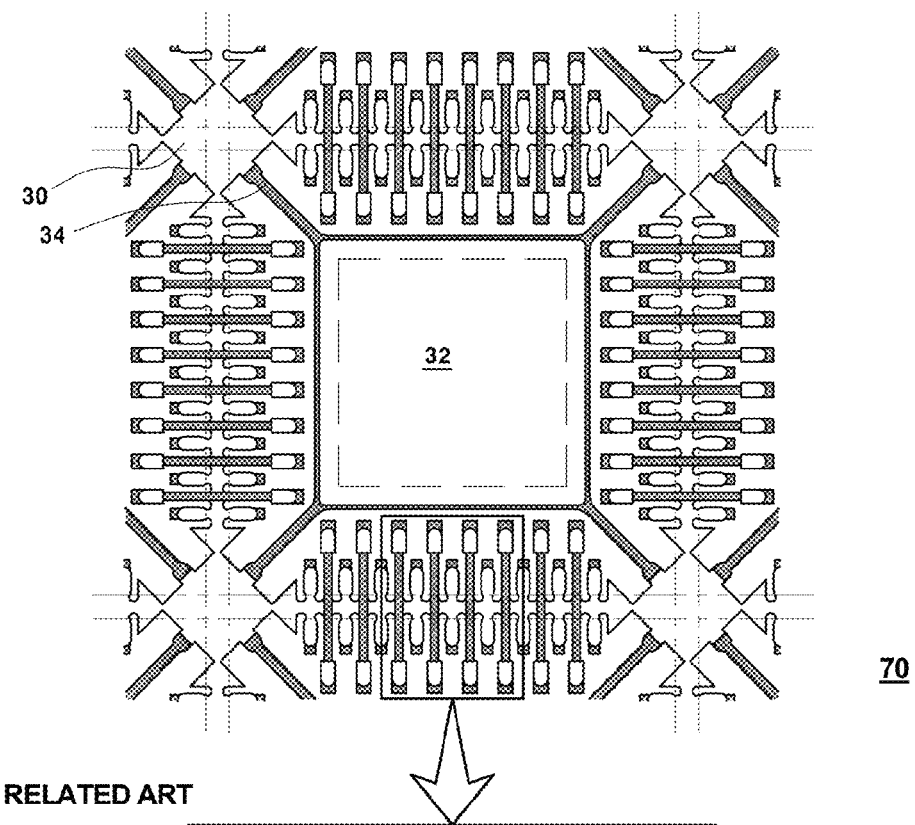
FIG. 9 is a bottom plan view of the related micro lead frame of FIG. 7.
Figure 9A:
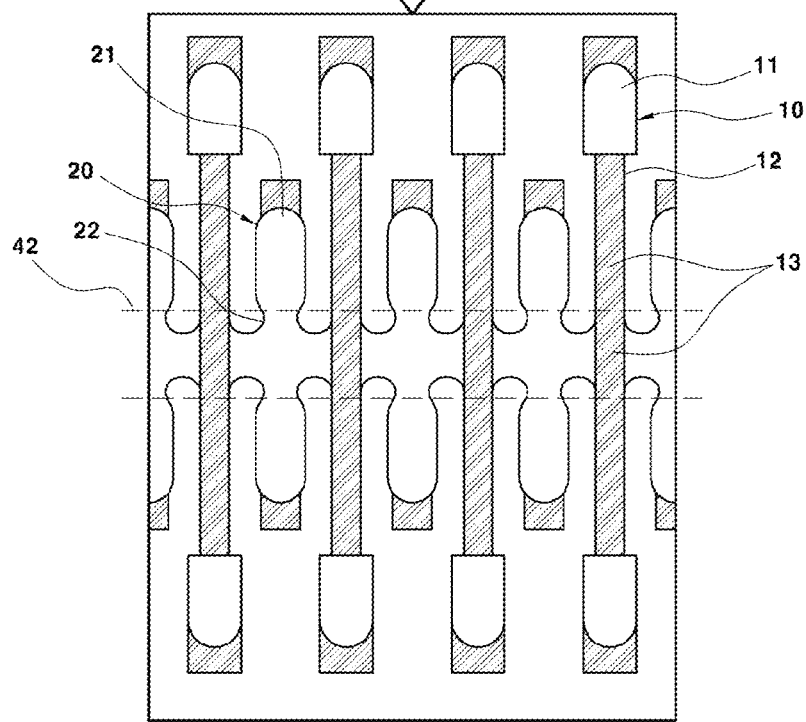
FIG. 9A is an enlarged bottom view of the related micro lead frame of FIG. 9.

FIGS. 7, 7A, and 8 are plan views and a partially enlarged image respectively showing an example of a related micro lead frame 70, and FIGS. 9, 9A and 10 are bottom views and a partially enlarged image of micro lead frame 70. As shown in FIGS. 7 through 10, micro lead frame 70 includes a plurality of inner leads 10 and a plurality of outer leads 20. Inner leads 10 are configured to have a longer length compared to outer leads 20. Inner leads 10 and outer leads 20 are arranged on all sides of a chip mounting plate 32 while being integrally connected to each other by connecting bars 40. Also, inner leads 10 and outer leads 20 form a staggered arrangement, and chip mounting plate 32 is connected to a side frame 30 with tie bars 34.

As shown in FIGS. 7, 7A, and 8, each inner lead 10 of micro lead frame 70 includes a bond finger 11 for bonding one end of a conductive wire, and an inner support bar 12 that extends from bond finger 11 to connecting bar 40 and has a long length compared to bond finger 11. The top surfaces of inner leads 10 including bond fingers 11 and inner support bars 12 reside on the same plane and are not etched. Each outer lead 20 of micro lead frame 70 includes a bond finger 21 for bonding one end of a conductive wire and an outer support bar 22 that extends from bond finger 21 to connecting 40. Outer support bars 22 are shorter than inner support bars 12. The top surfaces of bond fingers 21 reside on the same plane with each other and are not etched. Top etched portions 23 (for example, portions that are subjected to half etching and form a half thickness) are formed along the top surfaces of outer support bars 22 and portions of the top surfaces of connecting bars 40.

As shown in FIGS. 9, 9A and 10, which show the bottom structure of micro lead frame 70, bottom etched portions 13 (for example, portions that are subjected to half etching and form a half thickness) are formed along the entire length of inner support bars 12 and bottom portions (i.e., portions corresponding to each inner support bar 12 of each inner lead 10 in a straight line) of connecting bar 40. The bottom surfaces of bond fingers 10 reside on the same plane and are not etched. The bottom of each outer lead 20 and the bottom of the connecting bar 40 reside on the same plane and are not etched.

Bottom etched portions 13 are formed on inner leads 10 and top etched portions 23 are formed on outer leads 20 so that only the bottom surfaces of bond fingers 11 and the bottom surfaces of the bonds finger 21, which are full thickness, are exposed to the outside of the package after molding. Further, bottom etched portions 13 and top etched portions 23 are formed on the bottom and top of connecting bars 40 to minimize the material a saw blade must cut through thus making it easier to remove connecting bars 40 after the molding process. After connecting bars 40 are removed, inner 10 and outer leads 20 become isolated terminals for transmitting and receiving electrical signals.

Figure 11:
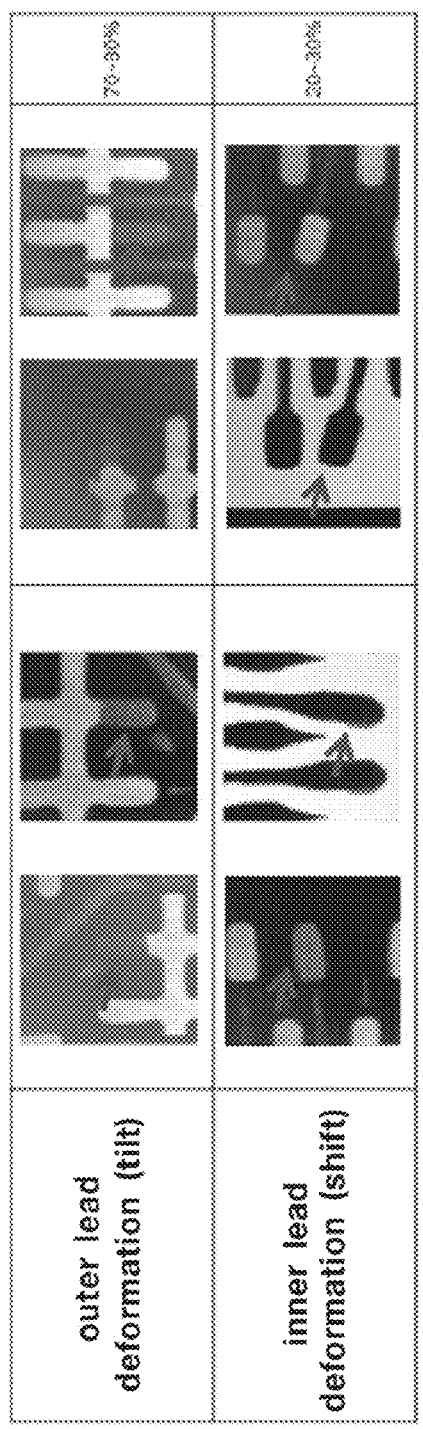
FIG. 11 is an image showing defects associated with the related micro lead frame after assembly processing.

There a several problems with the configuration of related micro lead frame 70 as described previously. Some of the problems are shown in FIG. 11, which shows images of portions of related micro lead frame 70 after the molding process and the sawing process have been completed. Specifically, because inner leads 10 and outer leads 20 are arranged in a staggered manner at a fine pitch, they become deformed. For example, one or more outer leads 20 may become vertically tilted or curved as shown in FIG. 11. Also, because inner leads 10 are long, they may shift to become horizontally bent or curved as shown in FIG. 11. Such defects may cause short circuit failures due to contact between the leads, thus resulting in a defective semiconductor package. Further, as each lead is pressed and cut by the blade in the sawing process, the sawn surface is contaminated with metal burrs or contamination (e.g. copper) dispersed from each lead. Such burrs may electrically connect adjoining leads together, thus causing an electric short circuit failure.

Referring now to FIGS. 1-6A, embodiments of a near chip scale package lead frame or micro lead frame 100 are described that address the issues described previously as well as others. In this regard, a micro lead frame provides a package footprint that is generally greater than about 50% smaller than conventional lead frames and that has a high die size to body size ratio (e.g., greater than 0.75 in some embodiments). In general, the micro lead frames in accordance with the present embodiments include stiffness reinforcing portions formed at different locations within the micro lead frame. In some embodiments, the stiffness reinforcing portions have a full thickness (i.e., not etched or recessed compared to the as-formed lead frame thickness) and are formed on or integrated within predetermined portions of the micro lead frame. In some embodiments, this can include portions of the inner leads, portions of the outer leads, portions of the connecting bars, or combinations thereof. The stiffness reinforcing portions are configured to reduce deformations from occurring when the inner and outer leads are handled during subsequent assembly processes thereby reducing the occurrence of deformation caused short circuits as well as short circuits caused by residual burrs or metal contamination after the singulation process.

In some embodiments, the micro lead frame with stiffness reinforcing portions can include a plurality of long inner leads and shorter outer leads provided around a chip mounting plate, to which an electronic chip (e.g., a semiconductor device, an optical device, a passive device, a sensor device) is attached, in a staggered arrangement, with a connecting bar integrally connecting the respective inner and outer leads prior to sawing, wherein tops of the inner leads form a same plane without etching, a bottom etching portion is formed on an inner support bar provided on a rear end, except for a bond finger provided on a front end to which wire is bonded, among a bottom area of the inner lead, and simultaneously, a first stiffness reinforcing portion is integrally formed on a bottom of the connecting bar that corresponds to the inner support bar in a straight line, a bottom of the outer lead and a bottom of the connecting bar that corresponds to a rear portion of the outer lead in a straight line form a same plane without etching, a second stiffness reinforcing portion is formed throughout an outer support bar of the rear end and a top of the connecting bar following the outer support bar, except for the bond finger of the front end to which the wire is bonded, on a top of the outer lead. In some embodiments, the stiffness reinforcing structures can be formed by leaving predetermined parts or predetermined portions of the micro lead frame at full thickness compared to related micro lead frames, such as micro lead frame 70.

Figure 1:
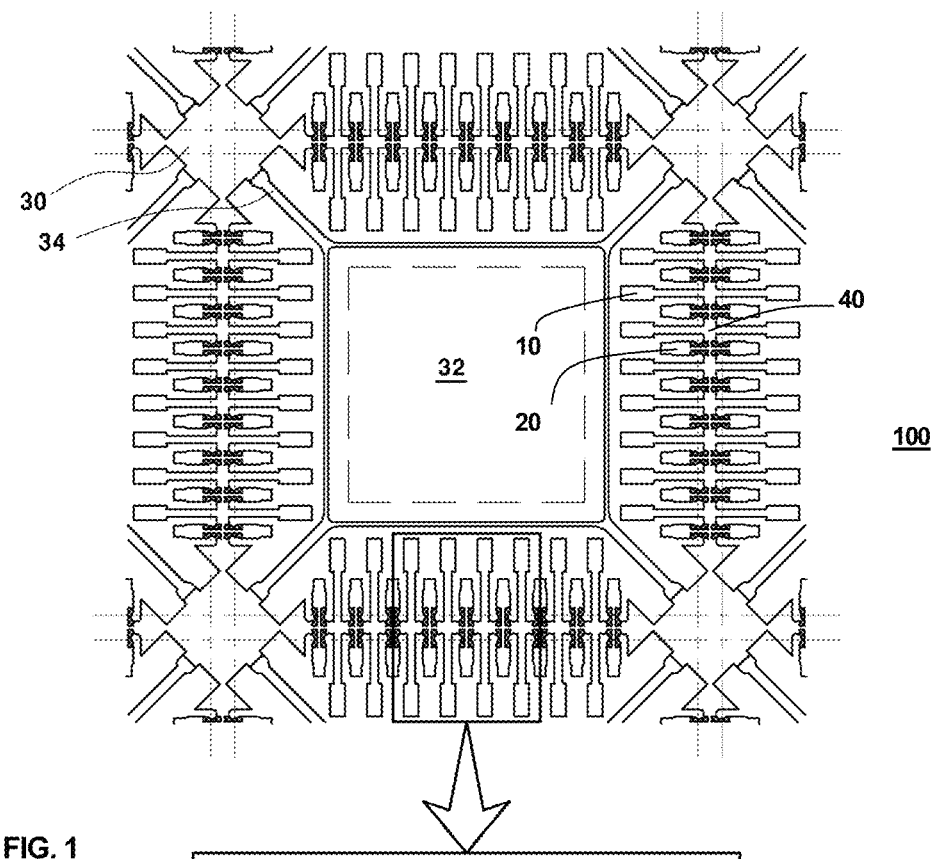
FIG. 1 illustrates a top plan view of an unsingulated micro lead frame structure including stiffness reinforcing structures in accordance with an embodiment of the present invention.
Figure 1A:
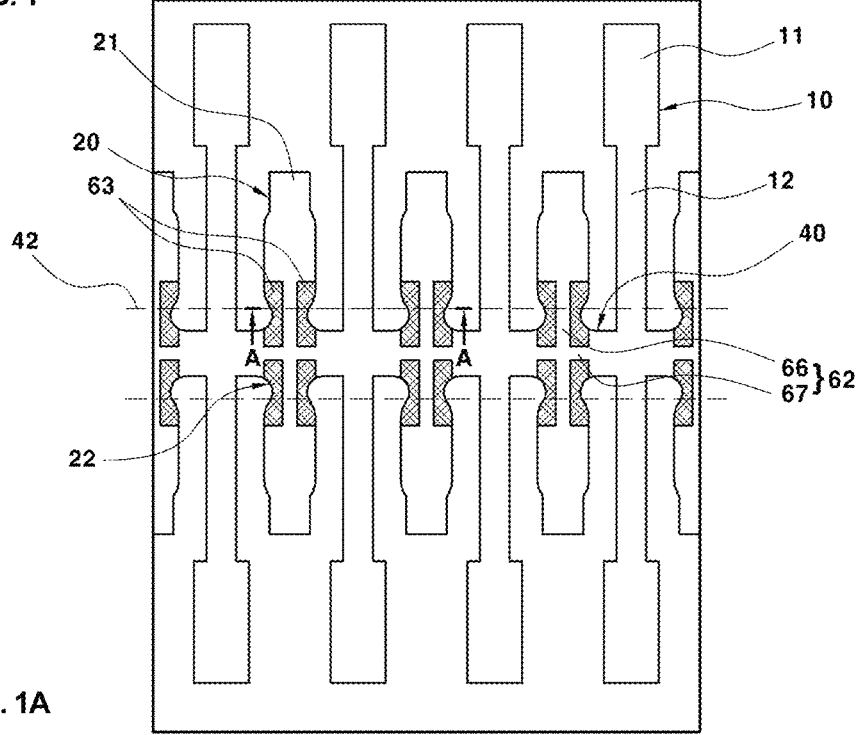
FIG. 1A illustrates an enlarged top plan view of the encircled portion of the embodiment of FIG. 1.
Figure 2:
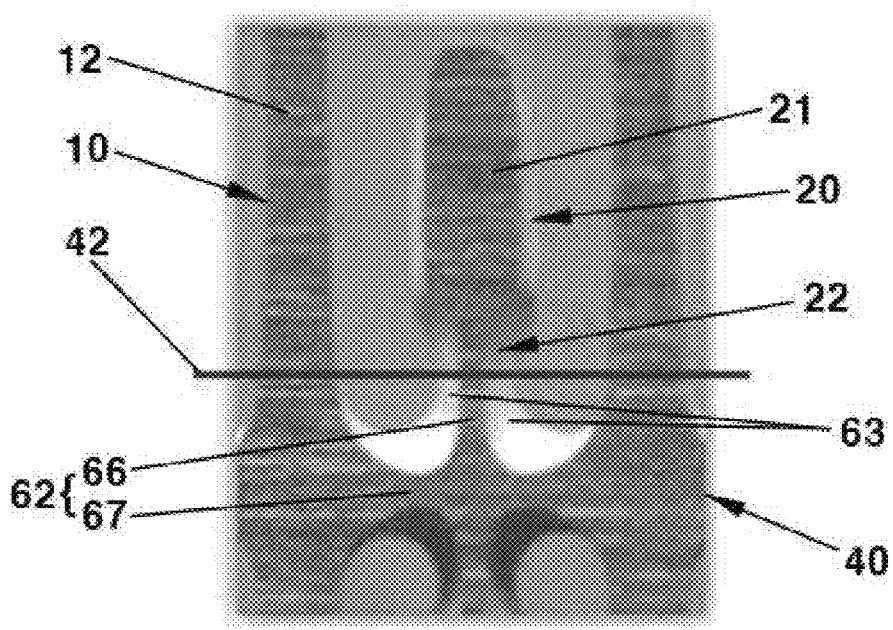
FIG. 2 is a top plan image highlighting portions of a micro lead frame having stiffness reinforcing structures in accordance with an embodiment of the present invention.
Figure 3:
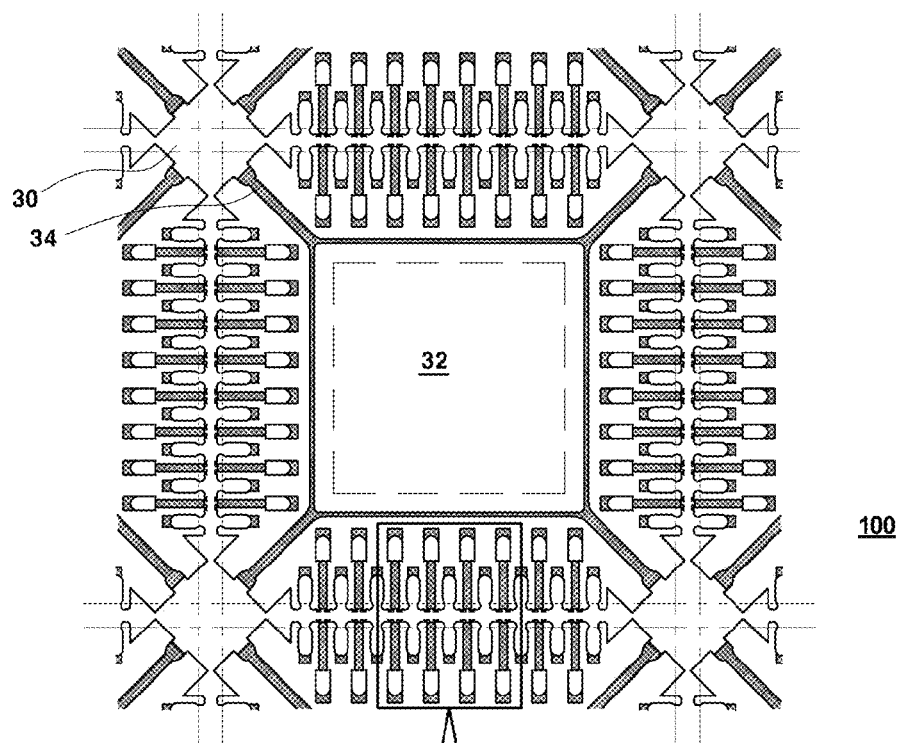
FIG. 3 illustrates a bottom plan view of the micro lead frame structure of FIG. 1 in accordance with an embodiment of the present invention.
Figure 6:
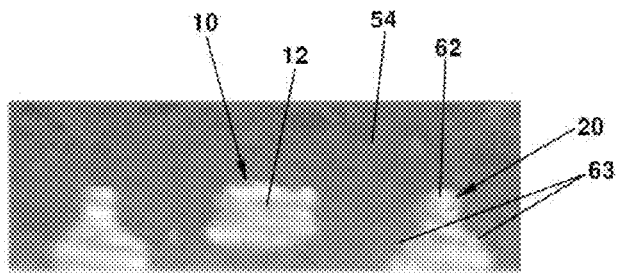
FIG. 6 is a side image view of a package assembled with a micro lead frame in accordance with the present invention after a molding step and a sawing step showing an embodiment of a stiffness reinforcing structure exposed in the side surface of the package body.
Figure 6A:
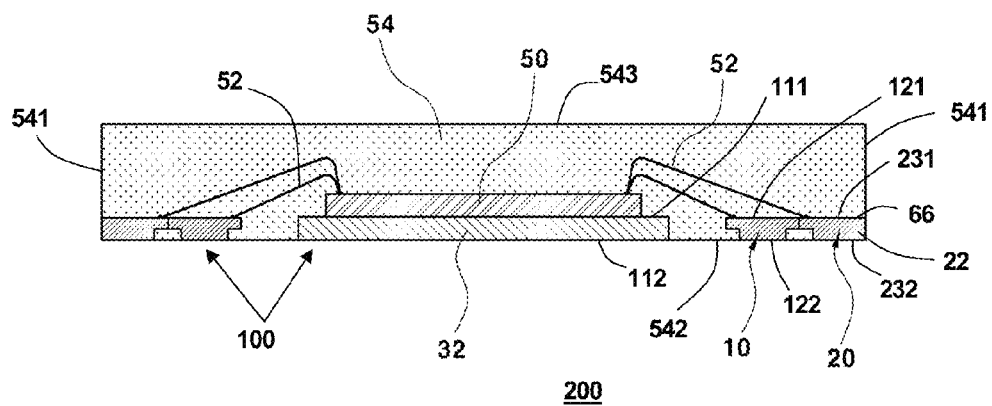
FIG. 6A illustrates a cross-sectional view of a packaged electronic device including a micro lead frame having stiffness reinforcing structures in accordance with the present invention.

FIG. 6A illustrates an electronic package or device 200 constructed in accordance with one embodiment. The micro lead frame 100 integrated into electronic package 200 is illustrated in its unsingulated state in FIGS. 1, 1A, 3, and 3A. Referring now to FIGS. 1, 1A, 2, 3, and 3A, in some embodiments, micro lead frame 100 comprises a generally quadrangular (e.g., square) chip mounting pad 32, die paddle 32, or die pad 32 that defines four peripheral edge segments. Additionally, die pad 32 defines opposed, generally planar top surface 111 and bottom surface 112 (illustrated in FIG. 6A). Micro lead frame 100 as illustrated in FIGS. 1 and 3 is part of a matrix of multiple micro lead frames with portions of the other micro lead frames illustrated and delineated by sawing or singulation lines 42.

In some embodiments, micro lead frame 100 comprises inner leads 10 and outer leads 20 with inner leads 10 being longer than outer leads 20. The inner and outer leads 10 and 20 are arranged on all sides of a chip mounting plate 32 in such a way as to be adjacent thereto or in spaced relationship therewith, and are arranged in a staggered manner at a fine pitch (e.g., in some embodiments between about 0.25 millimeter (mm) and about 0.85 mm). Integrally connected to die pad 32 is a plurality of tie bars 34. In some embodiments, micro lead frame 100 includes four tie bars 34 that extend diagonally from respective ones of the four corner regions defined by die pad 32 and are integrally connected to side frames 30. In one embodiment, tie bars 34 are identically configured to each other, and extend diagonally outwardly at predetermined lengths from respective ones of the corner regions of the die pad 32, with the integral connection of tie bars 34 to side frames 30 effectively supporting the die pad 32 within the interior of micro lead frame 100.

As further illustrated in FIG. 1, tie bars 34 each have a generally planar top surface that extends in generally co-planar relation to top surface 111 of die pad 32. However, as illustrated in FIG. 3, in some embodiments each tie bar 34 further defines an etched bottom surface that extends along the entire length thereof. The etched bottom surface of each tie bar 34 extends in generally co-planar relation to the etched surfaces inner leads 10 described later. In FIG. 3, the etched bottom surface of each tie bar 34 is indicated by condensed shading. During the fabrication process for electronic device 200 including micro lead frame 100, the encapsulant material used to form the package body of electronic device 200 is also able to flow over the etched bottom surfaces of tie bars 34, thus resulting in tie bars 34 being encapsulated by the package body, which enhances the bonding or mechanical interlock therebetween.

Side frames 30 are integrally connected to connecting bars 40, which circumvent and are spaced apart from die pad 32. In some embodiments of micro lead frame 100, connecting bars 40 are provided in the form of a substantially quadrangular (e.g., square) ring which interconnects to side frames 30. In some embodiments, connecting bars 40 define four peripheral segments that extend in spaced, generally parallel relation to respective ones of the peripheral edge segments of die pad 32. In a fabrication process for electronic package 200, which will be described in more detail below, connecting bars 40 are singulated or removed from micro lead frame 100 to electrically isolate other structural features of micro lead frame 100 from each other.

In one embodiment, inner leads 10 are preferably segregated into four (4) sets, with each set of the inner leads 10 extending generally perpendicularly from a corresponding one of the peripheral segments of connecting bars 40 inwardly toward a respective one of the peripheral edge segments of die pad 32. Each of inner leads 10 is sized such that the inner, proximate end thereof is spaced a predetermined distance from the corresponding peripheral edge segment of die pad 32. From the cross-sectional view illustrated in FIG. 6A, each of inner leads 10 includes a generally planar first or top surface 121 and an opposed, generally planar second or bottom surface 122. As illustrated in FIG. 1A, in some embodiments each of inner leads 10 includes a bond finger 11 and an inner support bar 12 extending from bond finger 11 and integrally connected with one of connecting bars 40. In one embodiment, the top surfaces of bond fingers 11, inner support bars 12 and the adjoining portions of connecting bars 40 reside on the same plane and are not etched or recessed.

In FIGS. 1 and 3, micro lead frame 100 is illustrated in its unsingulated state as positioned within a matrix of interconnected micro lead frames 100. In this regard, each inner lead 10 of micro lead frame 100 extends in opposed relation to a corresponding, identically configured inner lead 10 of an adjacent micro lead frame 100. As such, each peripheral segment of each connecting bar 40 can include two sets of inner leads 10 extending generally perpendicularly from each of the opposite sides thereof. Stated another way, for each peripheral segment of each connecting bar 40, a corresponding set of inner leads 10 of that micro lead frame 100 extends generally perpendicularly from one side thereof, with one set of inner leads 10 of an adjacent micro lead frame 100 extending generally perpendicularly from the opposite side thereof in opposed relation to respective ones of inner leads 10 of the other set.

Figure 3A:
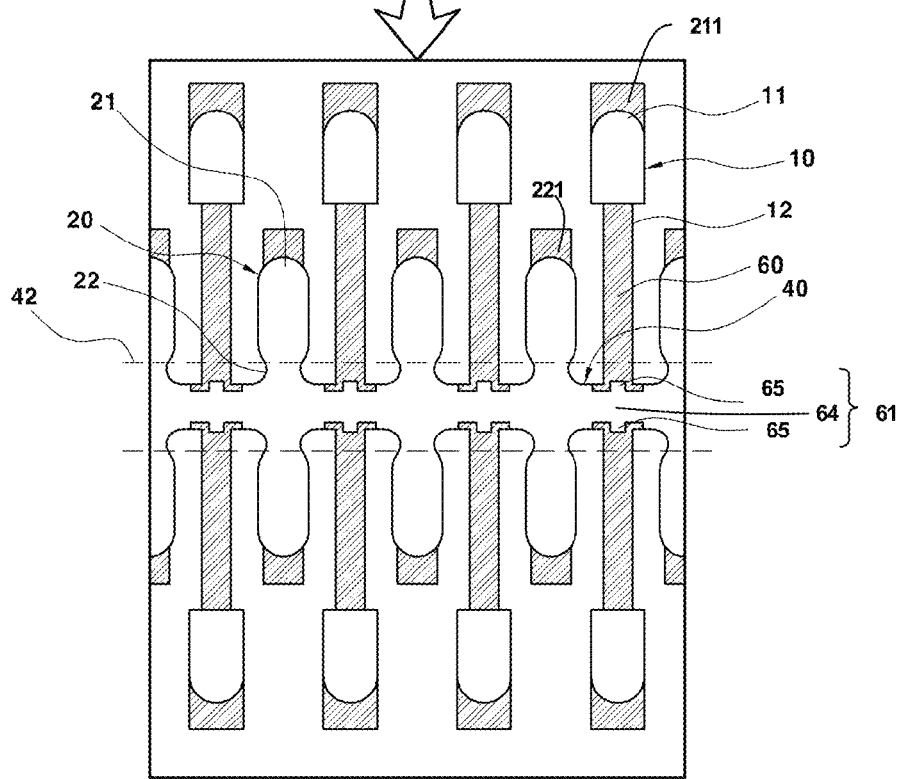
FIG. 3A illustrates an enlarged bottom plan view of the encircled portion of the embodiment of FIG. 3.

As illustrated in FIGS. 3A and 6A, each of inner leads 10 is not of uniform thickness. Rather, each of inner leads 10 is partially etched to include a bottom etched surface 60 that is disposed in opposed relation to the top surface 121, but is recessed relative to the bottom surface 122. As illustrated in FIG. 3A, in some embodiments bottom etched surface 60 extends the entire length of inner support bars 12, but unlike related micro lead frame 70 bottom etched surface 60 does not extend entirely across the adjoining portion of connecting bar 40. Also, in one embodiment, the proximate ends of inner leads 10 adjacent to die bad 32 are partially etched to form recessed portions 211. In some embodiments, recessed portions 211 are substantially confined to the tip portions of bond fingers 11 so as to maximize the exposed area of bond fingers 11 after the package body is formed. In FIGS. 3 and 3A, the bottom etched surfaces of micro lead frame 100 are indicated by the darker shading or condensed hatching that slopes downwardly from right to left. As will be recognized, the thickness of each inner leads 10 between top and bottom surfaces 121, 122 exceeds the thickness between top surface 121 and bottom etched surface 60.

In accordance with the present embodiment and illustrated in FIGS. 3 and 3A, one or more stiffness reinforcing portions 61 are integrally formed on bottom portions of connecting bars 40 that corresponds to a distal portion (i.e., with respect to die pad 32) of inner support bars 12 in a straight line. As illustrated in FIG. 3A, in some embodiments, one or more of stiffness reinforcing portions 61 can include a rectangular plate 64 and one or more protrusions or notches 65 that extend from upper and lower portions of plate 64 in the plan view towards and contiguous with inner support bars 12. Plates 64 adjoin or abut distal ends of inner support bars 12 and reside substantially on the same plane as the bottom surfaces of bond fingers 11. In one embodiment, notches 65 are bounded on three sides by recessed portions 60 and bounded on one side by a portion of connecting bar 40 having a full thickness (i.e., not etched or recessed).

It is understood that stiffness reinforcing portions 61 can have other shapes and forms configured to increase the stiffness or rigidity of inner leads 10. In some embodiments, the portion of the connecting bar 40 on which stiffness reinforcing portions 61 are formed has the full thickness in the same manner as bond fingers 11 of inner leads 10. In other embodiments, stiffness reinforcing portions 61 can have a thickness exceeding the full thickness of micro lead frame 100, thus increasing stiffness. Thus, in accordance with the present embodiments, portions of connecting bars 40 that adjoin the distal ends of inner support bars 12 where first stiffness reinforcing portions 61 are formed having the full thickness in the same manner as bond fingers 11 of inner leads 10 and in some embodiments having the original thickness of micro lead frame 100. This increases the stiffness or rigidity of inner leads 10 compared to related micro lead frames. In accordance with the present embodiment, stiffness reinforcing portions 61 are configured to reduce the likelihood that inner leads 10 are deformed in subsequent processing. Specifically, this configuration reduces the likelihood that inner leads 10 are vertically tilted and deformed during subsequent processing such as during sawing or singulation processes.

Figure 4:
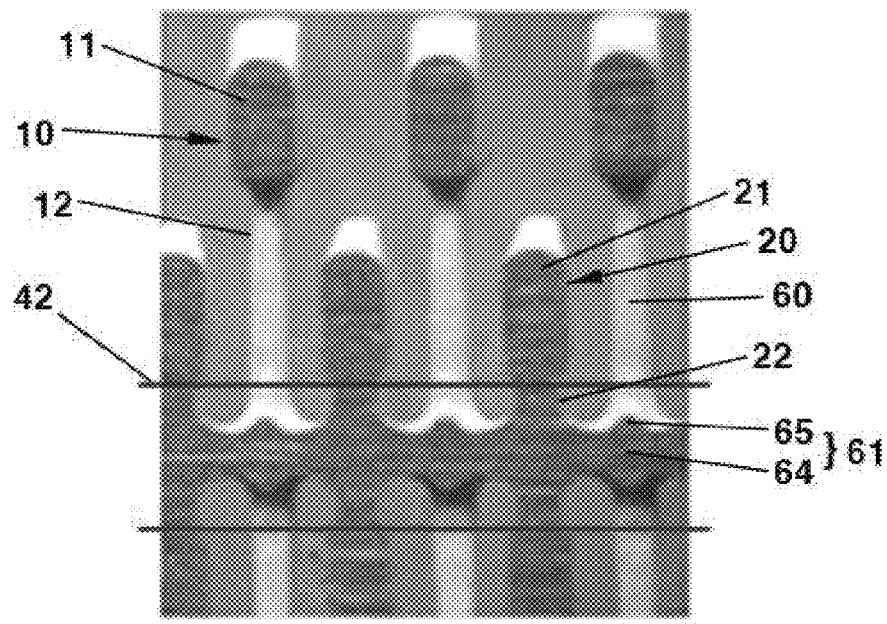
FIG. 4 is a bottom plan image highlighting portions of the micro lead frame having the stiffness reinforcing structures in accordance with an embodiment of the present invention.

In related micro lead frame 70 and as shown in FIG. 9A, bottom etched portions 13 are formed along the bottom surface of connecting bars 40, which corresponds to the rear portion of inner lead support bars 12 of inner leads 10 in a straight line. In contrast and in accordance with to the present embodiment, stiffness reinforcing portions 61 are integrally formed on the bottom portions of connecting bars 40, which corresponds to the rear or distal portion of inner support bars 12 of inner leads 10 in a straight line. In these sections of micro lead frame 100, inner support bars 12 and connecting bars 40 have the full thickness in the same manner as bond fingers 11 of inner leads 10. FIG. 4 is partial bottom plan image of one embodiment of stiffness reinforcing structures 61 in accordance with the present embodiment.

Micro lead frame 100 further includes a plurality of outer leads 20. Like inner leads 10, in one embodiment outer leads 20 are segregated into four (4) sets, with each set of outer leads 20 extending generally perpendicularly from a corresponding one of the peripheral segments of each connecting bar 40 toward a respective one of the peripheral edge segments of the die pad 32. Each of outer leads 20 is sized such that the inner, proximate end thereof is spaced a predetermined distance from the corresponding peripheral edge segment of die pad 32. From the cross-sectional view illustrated in FIG. 6A, each of outer leads 20 includes a generally planar first or top surface 231 and an opposed, generally planar second or bottom surface 232. As illustrated in FIG. 3A, in some embodiments each of outer leads 20 includes a bond finger 21 and an outer support bar 22 extending from bond finger 21 and integrally connected with one of connecting bars 40. In one embodiment, the bottom surfaces of bond fingers 21, outer support bars 22 and the adjoining portions of connecting bars 40 reside on the same plane and are not etched or recessed. In one embodiment, the proximate ends of outer leads 120 adjacent to die bad 32 are partially etched to form recessed portions 221. Recessed portions 221 are represented as the condensed hatching that slopes downwardly from right to left in FIG. 3A. In some embodiments, recessed portions 221 are substantially confined to the tip portions of bond fingers 21 so as to maximize the exposed area of bond fingers 21 after the package body is formed. Among other things, recessed portions 211 and 221 are configured to prevent insufficient filling or complete separation of the package body in the vicinity of bond fingers 11 and 21, and are further configured to fix leads 10 and 20 within the package body such that the bond fingers do not protrude from the bottom surface of the package body, but rather are substantially flush, coplanar, or continuous therewith.

As is apparent from FIG. 6A, top and bottom surfaces 121, 122 of each inner lead 10 and the top and bottom surfaces 231, 231 of outer leads 20 extend in substantially coplanar relation to respective ones of top and bottom surfaces 111, 112 of die pad 32. Those of ordinary skill in the art will recognize that the number of inner leads 10 and outer leads 20 included in each set thereof may vary from that illustrated in the figures without departing from the spirit and scope of the present invention.

As illustrated in FIG. 1A, portions of bond fingers 21, portions of outer connecting bars 22 and portions of connecting bars 40 are partially etched to form plurality of top etched or recessed portions 63, which are indicated by condensed shading or cross-hatching. Preferably, as illustrated in FIG. 1A a plurality of stiffness reinforcing portions 62 are provided adjoining recessed portions 63. Stated another way, in some embodiments, stiffness reinforcing structure 62 is defined by two opposed and spaced apart recessed portions 63 formed in outer support bars 22. In some embodiments, stiffness reinforcing portion 62 can be formed on sections of the top surfaces of outer support bars 22 provided on the rear or distal ends of bond fingers 21, which are neck portions that integrally connect bond fingers 21 to connecting bars 40, and can be formed on the top surfaces of connecting bars 40 adjoining outer support bars 22. In some embodiments, each stiffness reinforcing portion 62 can include a vertical bar 66 that extends from one or more outer support bars 22 of outer leads 20 to a central portion of an adjoining connecting bar 40, and a horizontal bar 67 that perpendicularly intersects vertical bar 66 in a cross shape. In some embodiments, vertical bar 66 extends the entire length of outer support bar 22. In accordance with the present embodiments, top etched portions 63 are formed adjoining stiffness reinforcing portions 62. That is, top etched portions 63 are subjected to partial etching and in one embodiment can be formed on the left and right sides or at least two opposing sides of vertical bars 66, and on the upper and lower sides or at least two opposing sides of horizontal bars 67. Vertical bars 66 and horizontal bars 67 comprise portions of micro lead frame 100 that are not etched or recessed thereby providing a thicker portion in parts of micro lead frame 100 susceptible to the deformation defects described previously when electronic device 200 is handled in the process of sawing or singulation after the molding process.

In some embodiments, stiffness reinforcing portions 62 are of the full thickness of micro lead frame 100. Therefore, outer support bars 22 and connecting bars 40 wherein stiffness reinforcing portions 62 are formed have the full thickness in the same manner as bond fingers 21 of outer leads 20, thus increasing the stiffness or rigidity of micro lead frame 100. In other embodiments, stiffness reinforcing portions 62 can have a thickness exceeding the full thickness of the rest of micro lead frame 100. In accordance with the present embodiment, stiffness reinforcing portions 62 are configured to reduce the likelihood that outer leads 20 are deformed in subsequent processing. It is understood that stiffness reinforcing portion 62 can have other shapes and forms that provide a reinforcement effect for outer leads 20 or other sections of micro lead frame 100 as described herein.

In related micro lead frame 70 and as shown in FIG. 7A, top etched portions 23 are formed throughout the top surface of outer support bars 22 provided on the distal ends of outer leads 20 and the top surfaces of connecting bars 40 adjoining outer support bars 22. In contract and in accordance with the present embodiment, second stiffness reinforcing portions 62 are integrally formed throughout the top surface of outer support bars 22 provided on the rear or distal ends of outer leads 20 and the top surfaces of connecting bars 40, which corresponds to the rear or distal portion of outer support bars 22 of outer leads 20 in a straight line. In these sections of micro lead frame 100, outer support bars 22 and connecting bars 40 have the full thickness in the same manner as bond fingers 21 of outer leads 20. FIG. 2 is partial top plan image of one embodiment of stiffness reinforcing structures 62 in accordance with the present embodiment.

Figure 5:
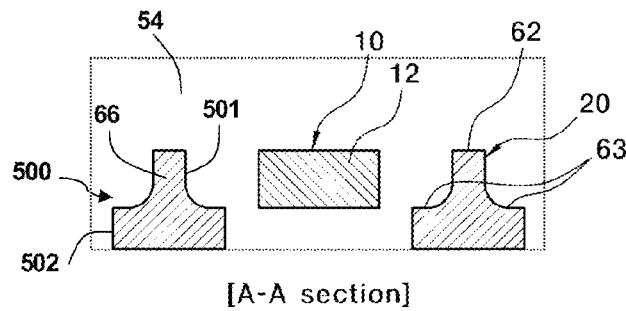
FIG. 5 illustrates a partial cross-sectional view of the micro lead frame in accordance with an embodiment of the present invention taken along reference line A-A of FIG. 1A and including an embodiment of a package body.

FIG. 5 illustrates a cross-section view taken along reference line A-A of FIG. 1A with the distal ends of one inner lead 10 and a pair of outer leads 20 exposed through a side surface of package body 54. As illustrated in FIG. 5, top etched portions 63 allow outer support bars 21 of outer leads 20 and connecting bars 40 adjoining outer support bars 21 where stiffness reinforcing portions 62 are formed, to have an inverted T-shaped cross-section 500 that is narrow at an upper portion 501 or upper position 501 and wide at a lower portion 502 or a lower position 502. One reason why the top etching portions 63 are further formed around the second stiffness reinforcing portion 62 on the outer lead 20 is because a distance to the inner lead 10 having an approximately rectangular cross-section is increased. To be more specific, the top etching portions 63 enable an upper end (an upper projection of a convex portion) of the outer lead 20 to be sharp and narrow in width, thus increasing the distance between outer lead 20 and an adjacent inner lead 10.

FIG. 6 is an image showing a side view of a portion micro lead frame 100 in accordance with the present embodiment after a molding process and after the packaged electronic device is singulating using a singulation process (e.g., saw or punch). Specifically, FIG. 6 shows outer leads 20 and an inner lead 10 exposed through or in the side surface of package body 54 formed by hardened molding compound resin. In accordance with the present embodiment, the distance between the upper end (the upper projection of the convex portion) of outer leads 20 and inner leads 10 is increased compared to related devices, thus reducing the likelihood that burrs produced during the singulation process through each lead bridge adjoining lead and causing electrical shorts. This is an improvement over related micro lead frame 70, which is susceptible to the metal burr defect problems as described herein.

Electronic package 200 using micro lead frame 100 of the present embodiment can be manufactured as illustrated in FIG. 6A by the following illustrative method. In a first step, micro lead frame 100 can be provided. Micro lead frame 100 typically comprises a conductive material, such as copper or a copper alloy, such as a dual gauge copper alloy. All or portions of micro lead frame 100 can be plated with a conductive material, such as tin, (Sn) and/or nickel, palladium, gold, and silver (NiPdAuAg). The features of micro lead frame 100 as described herein can be formed using masking and etching techniques. Alternatively, stamping techniques can be used as well or other techniques as known to those of ordinary skill in the art. In some embodiments, the pitch between inner leads 10 and outer leads 20 can be between about 0.25 mm and about 0.85 mm, and the full thickness (i.e., a thickness of the unetched or unrecessed portion of the respective lead) of inner leads 10 and outer leads 20 can be between about 0.15 mm and about 0.25 mm.

An electronic chip 50, such as a semiconductor chip can be attached to die pad 32, using, for example, an epoxy that can be thermally and/or electrically conductive. In some embodiments, bonding pads on electronic chip 50 are connected to bond fingers 11 of inner leads 10 using an electrically conductive wire 52, and connected to bond fingers 21 of outer leads 20 using other electrically conductive wires 52. In one embodiment, conductive wires 52 can be gold. In other embodiments, conductive wires 52 can be copper or other conductive materials as known to those of ordinary skill in the art. In some embodiments, a molding process, such as an over-molding process, can be used to encapsulate or seal electronic chip 50, conductive wires 52, and portions of inner leads 10 and outer leads 20 with molding compound resin to form a package body 54. In some embodiments, a singulation process, such as a sawing process, is used to separate the electronic packages from a matrix of micro lead frames 100 along separation or singulation lines 42. As illustrated in FIG. 6A, package body 54 includes side surfaces 541, a generally planar bottom surface 542, and a generally planar top surface 543.

In some embodiments, during the sawing process the saw blade moves along the singulation lines 42 to remove the molding compound resin molded within singulation lines 42 as well as connecting bars 40 so that electronic packages are separated into individual units. In some embodiments, the bottom surfaces of bond fingers 11 and bond fingers 21 remain or are exposed outside of the package body and reside substantially on the same plane as bottom surface 542 of package body 54, so as to provide means for bringing electrical signals into and out of electronic device 200 and to dissipate heat. Further, in some embodiments, bottom surface 112 of die pad 32 is also exposed outside of the package body to provide obtain a heat dissipating effect.

From all of the foregoing, one skilled in the art can determine that according to one embodiment, an electronic packaged device (for example, element 200) comprises a die pad (for example, element 32) having peripheral edge segments. A plurality of first leads (for example, element 10) is segregated into at least two sets that extend along respective ones of at least two peripheral edge segments of the die pad in spaced relation thereto, wherein each first lead includes a first bond finger (for example, element 11) proximate to the die pad and a first support bar (for example, element 12) extending outward from a distal end of the first bond finger in a direction away from the die pad, and wherein the first support bar includes a recessed bottom surface (for example, element 60). A plurality of second leads (for example, element 20) is segregated into at least two sets that extend along the respective ones of at least two peripheral edge segments of the die pad in spaced relation thereto, wherein each second lead includes a second bond finger (for example, element 21) proximate to the die pad and a second support bar (for example, element 22) extending outward from a distal end of the second bond finger in a direction away from the bond pad, and wherein the second support bar is shorter than the first support bar, and wherein the second support bar includes a stiffness reinforcing structure (for example, element 62) extending along a top surface that is configured to reduce movement of the second lead during assembly. An electronic die (for example, element 50) is attached to the die pad and electrically connected to at least some of the first leads and the second leads. A package body (for example, element 54) defines generally planar bottom and side surfaces (for example, elements 542, 541), the package body at least partially encapsulating the first leads, the second leads and the electronic die such that at least portions of the first leads and at least portions of the second leads are exposed in the bottom and side surfaces of the package body.

In another embodiment of the electronic packaged device, at least a portion of the stiffness reinforcing structure (for example, element 62) can be exposed in a side surface (for example, element 541) of the package body. In a further, embodiment the stiffness reinforcing structure can comprise an inverted T-shape in a cross-sectional view (for example, element 500) that is narrow at an upper portion (for example, element 501) and wide at a lower portion (for example, element 502). In another embodiment, the second support bar having the inverted T-shape cross-section can be exposed in a side surface (for example, element 541) of the package body. In a further embodiment, the first support bar has a top surface (for example, element 121) that is devoid of a stiffness reinforcing structure, the first bond finger has a recessed portion (for example, element 211) on an end proximate to the die pad, and the second bond finger has a recessed portion (for example, element 221) on an end proximate to the die pad. In another embodiment the first support bar can have a first cross-sectional shape in an end view, and the second support bar can have a view second cross-sectional shape in an end view that is different than the first cross-sectional shape. In yet another embodiment, the second cross-sectional shape is other than a square shape or a rectangular shape. In a further embodiment, the first bond finger and the second bond finger reside substantially on the same plane. In a still further embodiment, the stiffness reinforcing structure is defined by two opposed and spaced apart recessed portions (for example, element 63) in the second support bar. In a further embodiment, the first bond finger and the second bond finger can be spaced having a pitch less than approximately 0.85 millimeters, the first bond finger and the second bond finger can have a thickness less than approximately 0.25 millimeters, and the electronic packaged device is configured as a near chip scale packaged device.

Those skilled in the art will also appreciate that according to another embodiment, a method for forming an electronic packaged device (for example, element 200) includes providing a lead frame (for example, element 100) comprising: a die pad (for example, element 32), a connecting bar (for example, element 40) spaced apart from a peripheral edge segment of the die pad and generally parallel to the peripheral edge segment, a plurality of first leads (for example, element 10) that extend along the peripheral edge segment in spaced relation thereto, each first lead comprising: a first bond finger (for example, element 11) proximate to the die pad, and a first support bar (for example, element 12) extending from a distal end of the first bond finger and integrally connected to the connecting bar, the first support bar having a recessed bottom surface (for example, element 60), and a plurality of second leads (for example, element 20) that extend along the peripheral edge segment in spaced relation thereto, each second lead comprising: a second bond finger (for example, element 21) proximate to the die pad, and a second support bar (for example, element 22) extending outward from a distal end of the second bond finger of the second bond finger and integrally connected to the connecting bar, the second support bar having shorter length than the first support bar, wherein the connecting bar has a first stiffness reinforcing structure (for example, element 61) at a predetermined location on a bottom surface proximate to a distal end of the first support bar, and the second support bar includes a second stiffness reinforcing structure (for example, element 62) extending along a predetermined location of a top surface. The method includes attaching an electronic die (for example, element 50) to the die pad. The method includes forming a package body (for example, element 54) defining a generally planar bottom surface (for example, element 542), the package body at least partially encapsulating the first leads, the second leads and the electronic die such that at least portions of the first leads and portions of the second leads are exposed in the bottom surface of the package body. The method includes removing the connecting bar, wherein the first stiffness reinforcing structure and second stiffness reinforcing structure are configured to reduce movement of the first leads and the second leads during the removing step, and wherein the second stiffness reinforcing structure is exposed in a side surface (for example, element 541) of the package body after the removing step.

Those skilled in the art will also appreciate that according to a further embodiment of the described method, removing the connecting bar includes removing the first stiffness reinforcing structure. In a further embodiment, the method can include providing the first stiffness reinforcing structure comprising a rectangular flat plate (for example, element 64) with at least one protrusion (for example, element 65) extending from the flat plate onto a portion of the first support bar adjoining the connecting bar, providing the first bond finger and the second bond finger having thickness less than about 0.25 millimeters, and sawing the connecting bar. In yet a further embodiment, the method can include providing the second stiffness reinforcing structure extending only partially onto the connecting bar so that a portion of the connecting bar (for example, element 67) has a full thickness adjacent the second inner connect bar. In a still further embodiment, the method can include providing the second stiffness reinforcing structure having an inverted T-shape (for example, element 500) in a cross-sectional view.

Those skilled in the art will also appreciate that according to another embodiment, an electronic packaged device (for example, element 200) comprises: a die pad (for example, element 32) having a peripheral edge segment; a first lead (for example, element 10) along the peripheral edge segment in spaced relation thereto, wherein the first lead comprises: a first bond finger (for example, element 11) proximate to the die pad, and a first support bar (for example, element 12) extending from a distal end of the first bond finger in a direction away the die pad, wherein the first support bar includes a recessed bottom surface (for example, element 60). A second lead (for example, element 20) is along the peripheral edge segment in spaced relation thereto, wherein the second lead comprises: a second bond finger (for example, element 21) proximate to the die pad, and a second support bar (for example, element 22) extending from a distal end of the second bond finger in a direction away from the die pad, wherein the second support bar is shorter than the first support bar, and the second support bar includes a stiffness reinforcing structure (for example, element 62) along a top surface (for example, element 231) that is configured to reduce movement of the second leads during assembly. An electronic die (for example, element 50) is attached to the die pad and electrically connected (for example elements 52) to the first lead and to the second lead. A package body (for example, element 54) defining a generally planar bottom surface (for example, element 542) and side surfaces (for example, element 541) the package body at least partially encapsulating the first lead, the second lead, and the electronic die such that at least portions of the first bond finger and at least portions of the second bond finger are exposed in the bottom surface and the side surfaces of the package body, and wherein at least a portion of the stiffness reinforcing structure is exposed in one of the side surfaces.

Those skilled in the art will also appreciate that according to a further embodiment of the described structure, the stiffness reinforcing structure is bounded on two sides by recessed regions (for example, element 63) formed along the top surface of the second support bar. In another embodiment, a distal end of the second support bar is exposed in a side surface of the package body and has a first cross-sectional shape; a distal end of the first support bar is exposed in the side surface adjacent to the second support bar and has a second cross-sectional shape; and the first cross-sectional shape is different than the second cross-sectional shape. In a further embodiment, the first cross-sectional shape is an inverted T-shape (for example, element 500). In a still further embodiment, at least a portion of the die pad (for example, element 112) is exposed in the bottom surface of the package body; the first cross-sectional shape is a shape other than a square shape or a rectangle shape; the first support bar has a top surface devoid of a stiffness reinforcing structure; the first bond finger has a recessed portion (for example, element 211) on an end proximate to the die pad; and the second bond finger has a recessed portion (for example, element 221) on an end proximate to the die pad. In a further embodiment, the stiffness reinforcing structure is placed at predetermined portions of the lead frame.

Those skilled in the art will appreciate that according to a still further embodiment, A micro lead frame (for example, element 100) with a stiffness reinforcing portion formed and predetermined locations thereon (for example, element 61, 62), comprises: a plurality of long inner leads (for example, element 10) and shorter outer leads (for example, element 20) are provided around a chip mounting plate (for example, element 32), to which a semiconductor chip (for example, element 50) is attached, in a staggered arrangement, with a connecting bar (for example, element 40) integrally connecting the respective inner and outer leads prior to sawing, wherein tops of the inner leads form a same plane without etching, a bottom etching portion (for example, element 60) is formed on an inner support bar provided on a rear end, except for a bond finger (for example, element 11) provided on a front end to which wire (for example, element 52) is bonded, among a bottom area of the inner lead, and simultaneously, a first stiffness reinforcing portion (for example, element 61) is integrally formed on a bottom of the connecting bar that corresponds to the inner support bar in a straight line, a bottom of the outer lead and a bottom of the connecting bar that corresponds to a rear portion of the outer lead in a straight line form a same plane without etching, a second stiffness reinforcing portion (for example, element 62) is formed throughout an outer support bar (for example, element 22) of the rear end and a top of the connecting bar following the outer support bar, except for the bond finger (for example, element 21) of the front end to which the wire (for example, element 52) is bonded, on a top of the outer lead.

In another embodiment of the described the structure, the connecting bar on which the first stiffness reinforcing portion is formed has a full thickness in a same manner as the bond finger of the inner lead having the full thickness, or has a thickness exceeding the full thickness. In a further embodiment, the first stiffness reinforcing portion comprises a rectangular flat plate (for example, element 64), and several protrusions (for example, element 65) extending from upper and lower portions of the flat plate. In a still further embodiment, the outer support bar provided on the rear end of the outer lead on which the second stiffness reinforcing portion is formed and the connecting bar following the outer support bar have a full thickness in a same manner as the bond finger of the outer lead having the full thickness, or having a thickness exceeding the full thickness. In yet another embodiment, the second stiffness reinforcing portion comprises a vertical bar (for example, element 67) extending from the outer support bar of the outer lead to a central portion of the connecting bar, and a horizontal bar (for example, element 66) perpendicularly intersecting the vertical bar in a cross form. In another embodiment, top etching portions (for example, element 63) are formed on left and right sides of the vertical bar of the second stiffness reinforcing portion and upper and lower sides of the horizontal bar thereof. In a further embodiment, the top etching portions allow the outer support bar of the outer lead and the connecting bar following the outer support bar, on which the second stiffness reinforcing portion is formed, to have an inverted T-shaped cross-section (for example, element 500), which is narrow at an upper position (for example, element 501) and wide at a lower position (for example, element 502).

In view of all the above, it is evident that a novel structure and method is disclosed. Included in one embodiment, among other features, is a micro lead frame having stiffness reinforcing structures placed at predetermined locations on connective bars and/or lead structures. The stiffness reinforcement structures are configured to reduce deformation of the leads (for example, shifting, bending or tilting defects) during assembly. Additionally, the stiffness reinforcing structures can be formed with cross-sectional shapes that reduce electrical shorting defects caused by burr formation during singulation processes. Among other things, this improves the reliability of electronic devices assembled into micro lead frame or near chip scale packages. In some embodiments, the stiffness reinforcement structures are formed at predetermined locations on the micro lead frame by maintaining portions of the connecting bar and the leads at full thickness compared to related micro lead frames that include recessed portions on all portions of the lead support bars and all portions of the connecting bars that adjoin the lead support bars. Additionally, the shapes and predetermined locations of the stiffness reinforcing structures as described herein do not detrimentally impact the singulation process used to remove the connecting bars. For example, saw blade life is not notably reduced.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, an outer portion of the die pad can recessed or half-etched and portions of the leads can be pulled back from the side surface of the package body. The portions that are pulled back can be filled with epoxy mold compound or can be exposed. Also, package body 54 can be formed by overmolding and saw-through techniques, formed by cavity molding and punch techniques, or formed by other techniques as known to those of ordinary skill in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. An electronic packaged device, comprising:
a die pad having peripheral edge segments;
a plurality of first leads segregated into at least two sets that extend along respective ones of at least two peripheral edge segments of the die pad in spaced relation thereto, wherein each first lead includes a first bond finger proximate to the die pad and a first support bar extending outward from a distal end of the first bond finger in a direction away from the die pad, and wherein the first support bar includes a recessed bottom surface;
a plurality of second leads segregated into at least two sets that extend along the respective ones of at least two peripheral edge segments of the die pad in spaced relation thereto, wherein each second lead includes a second bond finger proximate to the die pad and a second support bar extending outward from a distal end of the second bond finger in a direction away from the die pad, and wherein the second support bar is shorter than the first support bar, and wherein the second support bar includes a stiffness reinforcing structure extending along a top surface of the second support bar that is configured to reduce movement of the second lead during assembly;
an electronic die attached to the die pad and electrically connected to at least some of the first leads and the second leads; and
a package body defining generally planar bottom and side surfaces, the package body at least partially encapsulating the first leads, the second leads and the electronic die such that at least portions of the first leads and at least portions of the second leads are exposed in the bottom and side surfaces of the package body.

2. The electronic packaged device of claim 1, wherein at least a portion of the stiffness reinforcing structure is exposed in a side surface of the package body.

3. The electronic packaged device of claim 1, wherein the stiffness reinforcing structure comprises an inverted T-shape in a cross-sectional view that is narrow at an upper portion and wide at a lower portion.

4. The electronic packaged device of claim 3, wherein the second support bar having the inverted T-shape is exposed in a side surface of the package body.

5. The electronic packaged device of claim 1, wherein:
the first support bar has a top surface that is devoid of a stiffness reinforcing structure;
the first bond finger has a recessed portion on an end proximate to the die pad; and
the second bond finger has a recessed portion on an end proximate to the die pad.

6. The electronic packaged device of claim 1, wherein:
the first support bar has a first cross-sectional shape in an end view;
the second support bar has a second cross-sectional shape in an end view that is different than the first cross-sectional shape.

7. The electronic packaged device of claim 6, wherein the second cross-sectional shape is other than a square shape or a rectangular shape.

8. The electronic packaged device of claim 1, wherein the first bond finger and the second bond finger reside substantially on the same plane.

9. The electronic packaged device of claim 1, wherein the stiffness reinforcing structure is defined by two opposed and spaced apart recessed portions in the second support bar.

10. The electronic packaged device of claim 1, wherein:
the first bond finger and the second bond finger are spaced having a pitch less than approximately 0.85 millimeters;
the first bond finger and the second bond finger have a thickness less than approximately 0.25 millimeters; and
the electronic packaged device is configured as a near chip scale packaged device.

11. An electronic packaged device, comprising:
a die pad having a peripheral edge segment;
a first lead along the peripheral edge segment in spaced relation thereto, wherein the first lead comprises:
a first bond finger proximate to the die pad, and
a first support bar extending from a distal end of the first bond finger in a direction away the die pad, wherein the first support bar includes a recessed bottom surface;
a second lead along the peripheral edge segment in spaced relation thereto, wherein the second lead comprises:
a second bond finger proximate to the die pad, and
a second support bar extending from a distal end of the second bond finger in a direction away from the die pad, wherein the second support bar is shorter than the first support bar, and wherein the second support bar includes a stiffness reinforcing structure along a top surface of the second support bar that is configured to reduce movement of the second leads during assembly;
an electronic die attached to the die pad and electrically connected to the first lead and to the second lead; and
a package body defining a generally planar bottom surface and side surfaces, the package body at least partially encapsulating the first lead, the second lead, and the electronic die such that at least portions of the first bond finger and at least portions of the second bond finger are exposed in the bottom surface and the side surfaces of the package body, and wherein at least a portion of the stiffness reinforcing structure is exposed in one of the side surfaces.

12. The electronic packaged device of claim 11, wherein the stiffness reinforcing structure is bounded on two sides by recessed regions formed along the top surface of the second support bar.

13. The electronic packaged device of claim 11, wherein:
a distal end of the second support bar is exposed in a side surface of the package body and has a first cross-sectional shape;
a distal end of the first support bar is exposed in the side surface adjacent to the second support bar and has a second cross-sectional shape; and
the first cross-sectional shape is different than the second cross-sectional shape.

14. The electronic packaged device of claim 13, wherein the first cross-sectional shape is an inverted T-shape.

15. The electronic packaged device of claim 13, wherein:
at least a portion of the die pad is exposed in the bottom surface of the package body;
the first cross-sectional shape is a shape other than a square shape or a rectangle shape;
the first support bar has a top surface devoid of a stiffness reinforcing structure;
the first bond finger has a recessed portion on an end proximate to the die pad; and
the second bond finger has a recessed portion on an end proximate to the die pad.

16. A packaged semiconductor device, comprising:
a die pad having a peripheral edge segment;
a first lead along the peripheral edge segment in spaced relation thereto, wherein the first lead comprises:
  a first bond finger proximate to the die pad, and
  a first support bar extending from a distal end of the first bond finger in a direction away the die pad, wherein the first support bar includes a recessed bottom surface;
a second lead along the peripheral edge segment in spaced relation thereto, wherein the second lead comprises:
  a second bond finger proximate to the die pad, and
  a second support bar extending from a distal end of the second bond finger in a direction away from the die pad, wherein the second support bar is shorter than the first support bar, and wherein the second support bar includes a reinforcing structure along a top surface of the second support bar that is configured to reduce movement of the second lead during assembly;
at least one semiconductor die attached to the die pad and electrically connected to the first lead and to the second lead; and
a package body defining a generally planar bottom surface and side surfaces, the package body at least partially encapsulating the first lead, the second lead, and the electronic die such that at least portions of the first bond finger and at least portions of the second bond finger are exposed in the bottom surface and the side surfaces of the package body, and wherein at least a portion of the reinforcing structure is exposed in one of the side surfaces.

17. The device of claim 16, wherein:
the reinforcing structure is along a top surface of the second support bar; and
the reinforcing structure is bounded on two sides by recessed regions formed along the top surface of the second support bar.

18. The device of claim 17, wherein:
a distal end of the second support bar is exposed in a side surface of the package body and has a first cross-sectional shape;
a distal end of the first support bar is exposed in one of the side surface adjacent to the second support bar and has a second cross-sectional shape; and
the first cross-sectional shape is different than the second cross-sectional shape.

19. The device of claim 18, wherein:
at least a portion of the die pad is exposed in the bottom surface of the package body; and
the first cross-sectional shape is a shape other than a square shape or a rectangle shape.

20. The device of claim 16, wherein:
the first bond finger and the second bond finger are spaced having a pitch less than approximately 0.85 millimeters;
the first bond finger and the second bond finger have a thickness less than approximately 0.25 millimeters; and
the packaged semiconductor device is configured as a near chip scale packaged device.

* * * * *